Feb. 26, 1952 N. E. WASHBURN 2,587,419

TELEVISION TUNER

Filed May 20, 1949 2 SHEETS—SHEET 1

INVENTOR:
Neil E. Washburn
BY
Miles B. Stevens & Co.
Attorneys.

Feb. 26, 1952 N. E. WASHBURN 2,587,419

TELEVISION TUNER

Filed May 20, 1949

2 SHEETS—SHEET 2

INVENTOR:
Neil E. Washburn
BY
Milo B. Stevens & Co.
Attorneys.

Patented Feb. 26, 1952 2,587,419

UNITED STATES PATENT OFFICE 2,587,419

TELEVISION TUNER

Neil E. Washburn, Chicago, Ill., assignor, by mesne assignments, to Lytle Engineering & Mfg. Co., a corporation of Illinois Application May 20, 1949, Serial No. 94,421

5 Claims. (Cl. 250—40)

My invention relates to tuners for television and other high frequency circuits, and one object is to provide a tuner for these uses which eliminates the need of accessory variables.

A further object is to provide a tuner which requires no wire leads and need not be integral with the circuit for which it is intended.

A still further object is to design a variable inductance multi-band tuner which uses sheet metal stampings in all parts of the resonant tank circuits.

Another object is to design a tuner of the above character which accomplishes continuous straight line frequency tuning from 55 to 88 mc. and thence from 175 to 215 mc. or vice versa by means of stamped sheet metal inductances. That is, the tuner is capable of tuning through two ranges or bands of frequencies, corresponding, by way of illustration to the range from 55 to 88 mc., corresponding to the low television band, and the range from 175 to 215 mc., corresponding to the high television band. These two bands are mentioned by way of illustration only.

An additional object is to construct a tuner which accomplishes 360 degree tuning in either rotary direction and contains integral switching means.

Another object is to design a tuner which accomplishes changes of frequency by varying the field of sheet metal inductances.

A still further object is to design a tuner which accomplishes wide range tuning, yet keeps at a minimum or extremely low value that part of the inductance which cannot be varied.

Another object is to provide a tuner which contains a padding section integral with the tuner.

An important object is to construct the novel tuner from parts which can in most instances be stamped or pre-fabricated, whereby to require a minimum of skill and time for assembling the tuner and therefore enable the same to be produced at relatively low cost.

With the above objects in view, and any others which may suggest themselves from the description to follow, a better understanding of the invention may be had by reference to the accompanying drawings, in which—

Figure 1:
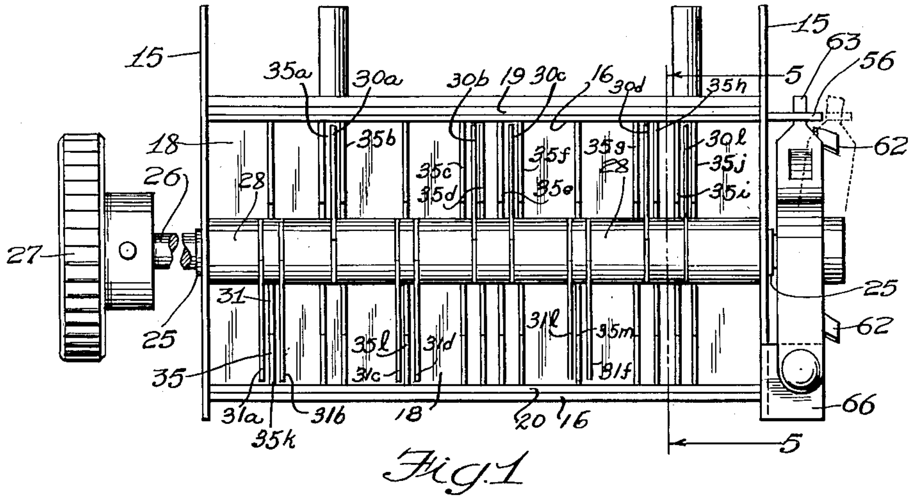
Fig. 1 is a side elevation of the tuner.

High frequency tuners for television and similar circuits are according to present developments devices of an extremely complicated and more or less delicate nature, due to the many coils, leads and connections involved and their closely grouped or internal locations. The work of constructing a tuner of conventional design is therefore an intricate task requiring carefully trained technicians and a considerable period of time, to the end that the tuner becomes an expensive piece of equipment, must be handled with great care and is apt to get out of order in case any of its numerous connections should weaken or loosen. Thus, while the conventional tuner is accepted as a generally satisfactory piece of equipment, it adds materially to the cost of the television or other apparatus of which it is a part, and develops electrical losses and risks because of its complicated and delicate nature. It has therefore been my intention to reduce a tuner of this character to a structure having simple electrical and mechanical values which, when once ascertained and materialized, produce a unit which can be standardized and assembled by unskilled workers.

In accordance with the foregoing, specific reference to the drawings indicates the front and rear walls of the tuner at 15, these being of metal and substantially square in form. The walls 15 are spaced at one side by upper and lower horizontal bars 16 and at the other side by upper and lower angle bars 17. These receive a side wall 18 of insulating material. A top wall 19 of insulating material is applied underneath the upper angle bar and over the upper horizontal bar, while a bottom wall 20 of such material is applied over the lower horizontal bar and underneath the lower angle bar. The walls are secured to the related metal parts by eyelet rivets 21.

The front and rear walls 15 are fitted with bearings 25 for a rotor shaft 26, the front end of the latter carrying a finger knob 27. Between the walls 15 the shaft 26 has a series of hub sections 28 between which are secured two sets of segmental rotor plates similar to those carried by variable radio condensers. The rotor plates of one set are designated $30^a$, $30^b$, $30^c$, $30^d$, and $30^e$, and the rotor plates of the other set are designated $31^a$, $31^b$, $31^c$, $31^d$, $31^e$, and $31^f$, respectively. However, the two sets 30 and 31 are arranged on opposite sides of the shaft or substantially 180 degrees apart. The plates 30 and 31 therefore operate as rotor blades; and their travel is in relation to a series of stator elements 35. These stator elements are as follows: For the rotor $30^a$ stators $35^a$ and $35^b$; for the rotor $30^b$ stators $35^c$ and $35^d$; for the rotor $30^c$ stators $35^e$ and $35^f$; for the rotor $30^d$ stators $35^g$ and $35^h$; for the rotor $30^e$ stators $35^i$ and $35^j$; for the rotors $31^a$ and $31^b$ stator $35^k$; for the rotors $31^c$ and $31^d$ stator $35^l$; and for the rotors $31^e$ and $31^f$ stator $35^m$.

Figure 7:
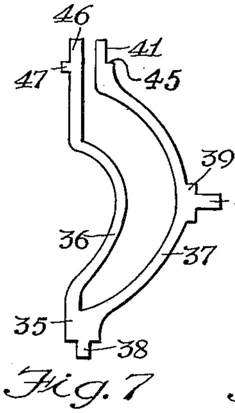
Figs. 7 and 8 are face and edge views of one of a plurality of stator elements contained in the tuner.
Figure 8:
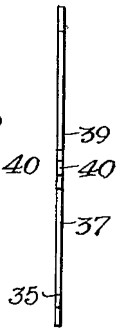
Figure 5:
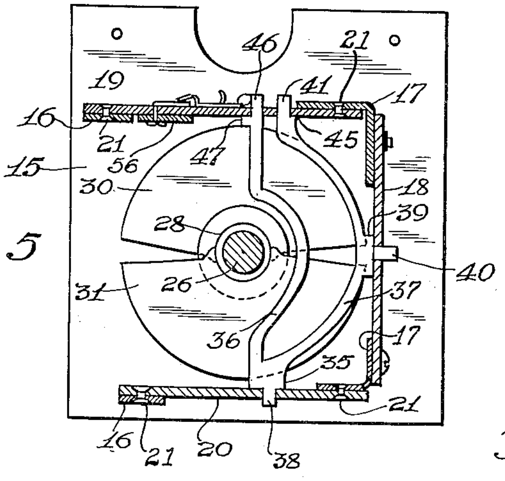
Fig. 5 is a section on the line 5—5 of Fig. 1.
Figure 9:
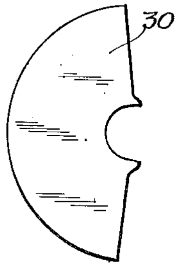
Figs. 9 and 10 are similar views of one of a series of rotor blades operative relative to the said stator elements.
Figure 10:
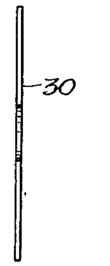

As noted particularly in Fig. 7, each stator element is a blank of sheet metal having the general form of a crescent. More specifically, the base of the element branches upwardly with a pair of substantially concentric arcuate bars 36 and 37. Primarily, each stator element is fashioned to become firmly anchored within the housing formed by the insulation material walls 18, 19, and 20. This is done at one point by reducing the base 35 with a stem 38 seating in a perforation made in the bottom wall 20. Next the crown of the bar 37 is thickened outwardly at 39, and then reduced with a stem 40 seating in a perforation made in the side wall 18. Next the upper end of the bar 37 is reduced with a stem 41 passing through a perforation made in the top wall 19, the stem defining a shoulder 45; and the upper end portion of the bar 36 projects as a stem 46 which passes through an adjoining perforation made in the same top wall, and has a side lug 47. The shoulder 45 and lug 47 serve as stops against the top wall 19. The stator element is thus fixed against deviation in any direction, and therefore maintains its position in accurate relation to the rotor blades 30 and 31 as illustrated in Fig. 5. The stems 41 and 46 constitute stator terminals which are connected into the circuit of Fig. 6.

Figures 2, 3:
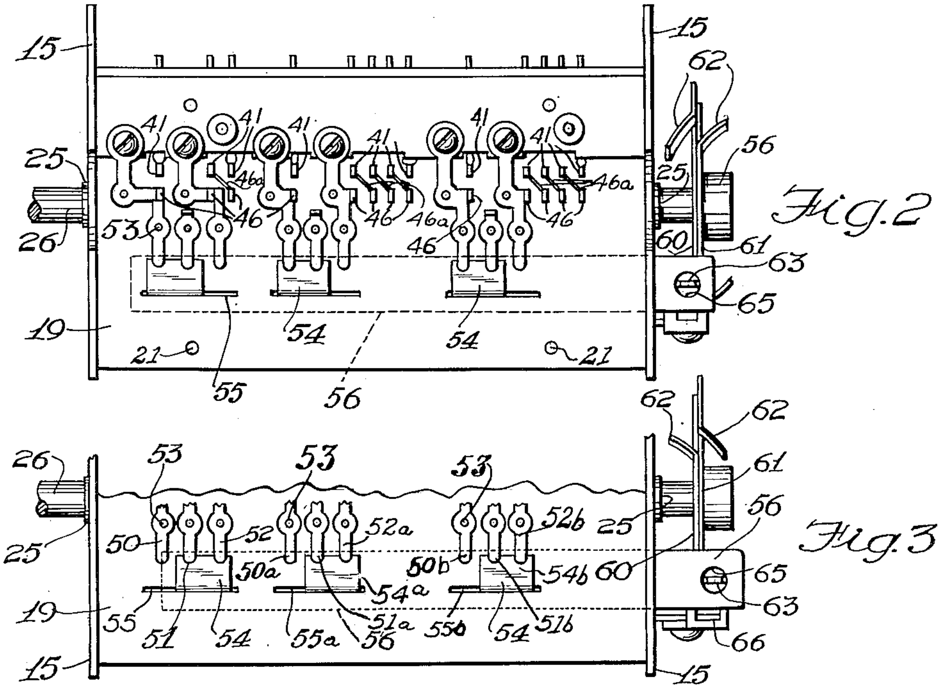
Fig. 2 is a top plan view showing the switch of the tuner positioned for high frequencies.
Fig. 3 is a similar fragmentary view showing the switch set for low frequencies.
Figure 4:
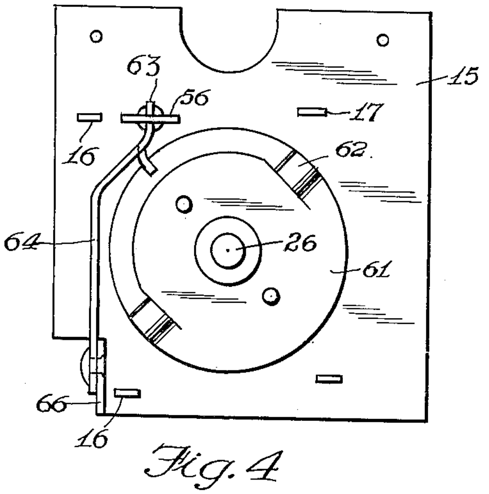
Fig. 4 is a right-hand side view of Fig. 1.
Figure 6:
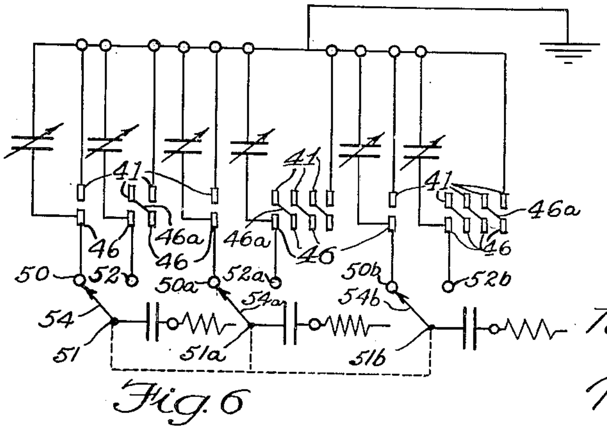
Fig. 6 is a diagram of the circuit controlled by the tuner.

The tuner is designed for the control of the circuit illustrated in Fig. 6 for example, and the arrangement of the stators is with three single units for tuning the high frequency band, a double unit for the low band, and two quadruple units for tuning the radio frequency and mixer stages. The stators are represented in the plan view of Fig. 2, and in the circuit diagram by their top stems 41 and 46, to which the wiring of the circuit is applied. In each of the tuning units in which two or more stator elements are employed the terminals 41 of such stator elements are series connected to the terminals 46 of the next adjacent stator elements of such tuning units by the leads $46^a$, as shown in Figs. 2 and 6.

The tuner terminals are identified for switching purposes by three banks of stems 50, 51 and 52 $50^a$, $51^a$, and $52^a$, and $50^b$, $51^b$, and $52^b$, respectively secured by rivet eyelets 53 on the top wall 19. A series of blades 54 $54^a$ and $54^b$ are adapted to be in frictional engagement with the stems 50 and 51 $50^a$ and $51^a$, and $50^b$ and $51^b$ respectively to connect the tuner for high frequency, as shown in Fig. 2. The blades are joined through slots 55 $55^a$ and $55^b$ in the top wall 19 to an insulating strip 56 which extends along the under side of the said wall. Thus, when the strip 56 is slid from the position of Fig. 2 to that of Fig. 3, the blades 54 $54^a$ and $54^b$ change connection from the terminal stems 50 and 51, $50^a$ and $51^a$ and $50^b$ and $51^b$ to the stems 51 and 52, $51^a$ and $52^a$ and $51^b$ and $52^b$ as shown, connecting the tuner for low frequency. The various stator terminals and stems and switch blades above defined are shown in Fig. 6 with the corresponding numerical designations.

The frequency changing switch arrangement just described is controlled by turning the finger knob 27, and means are provided to accomplish the switching action at the proper point in the rotation of the rotor shaft 26. Thus, the latter carries a pair of discs 60 and 61 made fast in doubled relation. The discs are formed with pairs of opposed and outwardly bent wing cams 62 at diametrically-opposite points, these cams having influence on a follower lug 63 carried by a vertical arm 64 located shortly behind the rear wall 15. The upper end of the arm passes through an opening 65 in the slide strip 56; and the lower end of the arm is pivoted to a wing 66 bent rearwardly from the rear wall 15. Thus, when the disc assembly 60—61 is rotated, the effect of consecutive influence of each pair of cams 62 on the lug 63 is to swing the arm 64 between the full and dotted line positions shown in Fig. 1, operating the switch irrespective of the direction in which the control knob is rotated.

It is now apparent that the novel tuner has a number of important features. First, no coil forms with wound inductances—which produce dielectric losses—are employed, air being the dielectric in the present tuner. Further, a variable inductance, multi-band tuner is had which utilizes metal stampings on all parts of the resonant tank circuits to accomplish continuous, straight-line frequency tuning from 55 to 88 mc. and from 175 to 215 mc.—or vice versa. Further, the tuner is designed for continuous 360 degree operation in either rotary direction with integral and automatic switching. Further, the tuner embodies a basic unit for high frequency tuning which is independent of the circuit controlled by the tuner. Further, the tuner accomplishes wide range tuning while keeping at a minimum or extremely low value that part of the inductance which cannot be varied. Further, the tuner contains a padding section integral with the tuner. Further, each stator element is the equivalent of a single turn inductance coil and designed to secure straight-line frequency tuning. Finally, the tuner is made of parts which can in most instances be stamped or prefabricated to required standards and capable of being assembled without particular skill, so that it is possible to produce the tuner at relatively low cost.

While I have described the invention along specific lines, various minor changes or refinements may be made therein without departing from its principle, and I reserve the right to employ all such changes and refinements as may come within the scope and spirit of the appended claims.

I claim:

1. A radio tuner for tuning sequentially through at least two ranges of frequencies, said tuner including at least two inductance-condenser tuning sets together with other tuning circuit elements, said tuner including a shaft journalled for rotation through a total angular displacement corresponding to tuning through all said sequentially tunable ranges, each tuning set including a condenser of normally fixed capacitance value and a variable inductance element in connection therewith and serving to increase tuned frequency as the inductance value of said inductance element is reduced, each variable inductance element including at least one U-shaped stator, insulating means to support said stator with its arms extending substantially tangentially to the rotation of the shaft and lying in a plan normal to the shaft axis, and each variable inductance element also including at least one rotor plate, means to mount said rotor plate on the shaft within a plane normal to the shaft and axially displaced from the corresponding stator, said rotor plate being insulated from the shaft, the rotor plate elements for two of the variable inductances being angularly displaced by substantially 180 degrees from each other to ensure progressive increase of angular alignment of one rotor plate with its stator from a position of zero alignment to a position of complete alignment for decrease of inductance from a maximum to a minimum value synchronously with progressive angular de-alignment of the other rotor plate with its stator from a position of complete alignment to a position of zero alignment, for increase of inductance from a minimum to a maximum value, during each 180 degrees of shaft rotation, two position switching means, and connections between said switching means and both of the variable inductance stator elements and said other tuning circuit elements effective to include one only of said stator elements in circuit with said other tuning circuit elements when the switching means is in one switching position, and to include the other only of said stator elements in circuit with said other tuning circuit elements when the switching means is in the other switching position, together with operating means connecting the shaft and the switching means said operating means having a change-over position and being effective to move the switching means to disconnect one stator element from said other circuit elements and to connect the other stator element to said other circuit elements when the shaft is rotated through said change-over position, said connecting means being effective to disconnect the stator of the completely aligned inductance from said other circuit elements and to connect the stator of the zero aligned inductance to said other circuit elements when the shaft is rotated through said change-over position.

2. A tuner as defined in claim 1 wherein at least one of the variable inductance stator elements comprises a plurality of U-shaped stator units, and series connections between said stator units of said stator element.

3. A tuner as defined in claim 1 wherein all of the stator elements are in alignment with each other parallel to the shaft.

4. A tuner for tuning a radio receiving circuit to any selected frequency in each of two bands of frequencies, said tuner including a variable impedance element for each of said bands, each of said variable impedance elements including a rotary impedance varying member, said variable impedance elements comprising portions of the receiving circuit elements, means to simultaneously rotate said rotatable impedance varying elements through a range of rotation corresponding to both of said bands of frequencies, one zone of said range of rotation corresponding to frequencies tuned in one band and another zone of said range of rotation corresponding to frequencies tuned in the other band, each rotatable impedance varying member being effective to vary the tuning frequency during rotation through the zone of rotation corresponding to the band tuned by the variable impedance element of which such rotatable impedance varying member is a part.

5. A tuner for tuning a radio receiving circuit to any selected frequency in each of two bands of frequencies, said tuner including a variable impedance element for each of said bands, each of said variable impedance elements including a rotary impedance varying member, said variable impedance elements comprising portions of the receiving circuit elements, means to simultaneously rotate said variable impedance varying elements through a range of rotation corresponding to both of said bands of frequencies, one zone of said range of rotation corresponding to frequencies tuned in one band and another zone of said range of rotation corresponding to frequencies tuned in the other band, each rotatable impedance varying member being effective to vary the tuning frequency during rotation through the zone of rotation corresponding to the band tuned by the variable impedance element of which such rotatable impedance varying member is a part, together with switching means in connection with each of said variable impedance elements, connections between said variable impedance elements, said receiving circuit, and said switching means to control connection of each variable impedance element with said receiving circuit, an operative connection between said rotary impedance varying means and said switching means, said operative connection being effective to move said switching means to position to include one of said variable impedance elements in tuning connection with said receiving circuit when rotating in one of said zones, and being effective to move said switching means to position to include the other of said variable impedance elements in tuning connection with said receiving circuit when rotating in the other of said zones.

NEIL E. WASHBURN.

REFERENCES CITED

The following references are of record in the file of this patent:

UNITED STATES PATENTS

| Number | Name | Date |
|---|---|---|
| 1,951,542 | Bradley | Mar. 20, 1934 |
| 2,246,928 | Schick | June 24, 1941 |
| 2,341,345 | Van Billiar | Feb. 8, 1944 |
| 2,367,681 | Karplus et al. | Jan. 23, 1945 |
| 2,471,523 | Gusdorf et al. | May 31, 1949 |
| 2,471,705 | Schmitt | May 31, 1949 |
| 2,503,579 | Fisher | Apr. 11, 1950 |
| 2,521,963 | Beusman | Sept. 12, 1950 |